United States Patent
Lee et al.

(10) Patent No.: US 8,106,712 B2
(45) Date of Patent: Jan. 31, 2012

(54) SYSTEMS AND METHODS FOR SELF-MIXING ADAPTIVE BIAS CIRCUIT FOR POWER AMPLIFIER

(75) Inventors: Dong Ho Lee, Cedar Rapids, IA (US); Kyu Hwan An, Dunwoody, GA (US); Chang-Ho Lee, Marietta, GA (US); Joy Laskar, Marietta, GA (US)

(73) Assignees: Georgia Tech Research Corporation, Atlanta, GA (US); Samsung Electro-Mechanics, Gyunngi-Do (KR)

( * ) Notice: Subject to any disclaimer, the term of this patent is extended or adjusted under 35 U.S.C. 154(b) by 97 days.

(21) Appl. No.: 12/623,136

(22) Filed: Nov. 20, 2009

(65) Prior Publication Data
US 2010/0156536 A1    Jun. 24, 2010

Related U.S. Application Data

(60) Provisional application No. 61/140,661, filed on Dec. 24, 2008.

(51) Int. Cl.
*H03F 3/04* (2006.01)
(52) U.S. Cl. ........................ 330/296; 330/285
(58) Field of Classification Search .............. 330/136, 330/261, 285, 296, 311, 277
See application file for complete search history.

(56) References Cited

U.S. PATENT DOCUMENTS

| 5,420,536 | A |   | 5/1995 | Faulkner et al. |         |
|-----------|---|---|--------|-----------------|---------|
| 5,712,593 | A |   | 1/1998 | Buer et al.     |         |
| 6,069,530 | A | * | 5/2000 | Clark           | 330/136 |
| 7,679,448 | B1| * | 3/2010 | McAdam et al.   | 330/285 |

FOREIGN PATENT DOCUMENTS

| KR | 10-2005-0097665 | 10/2005 |
| KR | 10-2008-0010569 | 1/2008  |

OTHER PUBLICATIONS

Office Action for Korean Application No. 10-2009-0131123 dated Mar. 10, 2011.

* cited by examiner

*Primary Examiner* — Khanh Nguyen

(57) ABSTRACT

Systems and methods for providing a self-mixing adaptive bias circuit that may include a mixer, low-pass filter or a phase shifter, and a bias feeding block. The self-mixing adaptive bias circuit may generate an adaptive bias signal depending on input signal power level. As the input power level goes up, the adaptive bias circuit increases the bias voltage or bias current such that the amplifier will save current consumption at low power operation levels and obtain better linearity at high power operation levels compared to conventional biasing techniques. Moreover, the adaptive bias output signal can be used to cancel the third-order intermodulation terms (IM3) to further enhance the linearity as a secondary effect.

18 Claims, 9 Drawing Sheets

SYSTEMS AND METHODS FOR SELF-MIXING ADAPTIVE BIAS CIRCUIT FOR POWER AMPLIFIER

RELATED APPLICATION

The present application claims priority to U.S. Patent Application No. 61/140,661, filed Dec. 24, 2008, and entitled "SYSTEMS AND METHODS FOR SELF-MIXING ADAPTIVE BIAS CIRCUIT FOR POWER AMPLIFIER", which is hereby incorporated by reference in its entirety as if fully set forth herein.

FIELD OF INVENTION

The invention relates generally to power amplifiers, and more particularly, to systems and methods for adaptive biasing of the power amplifiers.

BACKGROUND OF THE INVENTION

An amplifier typically has low efficiency and large linearity margins at low-power regions, and high efficiency and small linearity margins at high-power regions. For linear amplifiers, the linearity is limited at the highest output power condition, which is known as the saturated region. The linearity and efficiency of an amplifier may be affected by the bias conditions of the amplifier.

Amplifiers may be classified depending on their associated bias level and current conduction angle. These classifications include class-A, class-B, class-AB, and class-C amplifiers. For instance, a class-A amplifier has the highest bias level with the highest linearity, and a class-C amplifier has the lowest bias level with the lowest linearity. In contrast, class-A amplifiers have the lowest efficiency, and class-C amplifier has the highest efficiency. This is typically because the efficiency of an amplifier has an opposite reaction to bias conditions than that of an amplifier's linearity.

Fundamental configurations of most conventional adaptive biasing schemes for power amplifiers are composed of a signal sampler, a low-pass filter, a power detector, and a bias feeding block. FIG. 1 shows a schematic diagram for a conventional power amplifier with a conventional adaptive bias circuit. It also shows signal spectrums and time-domain signals at several points assuming that the input signal is a two-tone signal. For the power amplifier (PA) shown in FIG. 1, an output signal is sampled by a signal sampler, and the sampled signal is filtered by a low-pass filter. The filtered signal power is detected by a power detector, and the detected signal is fed into the power amplifier through a bias feeding block. The bias of the power amplifier is dynamically changed depending on the output power of the power amplifier. Eventually, the adaptive biasing scheme adjusts the power amplifier to maximize efficiency with an allowable distortion.

BRIEF SUMMARY OF THE INVENTION

Example embodiments of the invention may provide for a self-mixing adaptive bias circuit, which may include a mixer, a low-pass filter, and a bias feeding block. In an example embodiment of the invention, the adaptive bias circuit may generate gate bias voltage or base current depending on an input signal power level. As an input power level goes up, the self-mixing adaptive bias circuit increases the bias voltage or bias current. Moreover, the adaptive bias output signal can be used to cancel the third-order intermodulation terms (IM3). Then, it will enhance the linearity as a secondary effect.

According to an example embodiment of the invention, there is a self-mixing adaptive bias circuit. The self-mixing adaptive bias circuit may include a signal sampler that samples an output signal of an amplifier to generate a sampled output signal; a mixer that mixes the sampled output signal with an input signal to the amplifier to generate a mixed signal, where the sampled output signal and the input signal have a same carrier frequency; a low-pass filter that filters out high frequency components from the mixed signal to generate an adaptive bias signal; and a bias feeding block that provides the adaptive bias signal to an input of the amplifier.

According to another example embodiment of the invention, there is another self-mixing adaptive bias circuit. The self-mixing adaptive bias circuit may include a signal sampler that samples an output signal of an amplifier to generate a sampled output signal; a mixer that mixes the sampled output signal with an input signal to the amplifier to generate a mixed signal having a baseband signal and second harmonic signals, where the sampled output signal and the input signal have a same carrier frequency; a phase shifter that shifts the phase of baseband or second harmonic signals from the mixed signal to achieve cancellation of third-order intermodulation terms generated by the nonlinearity of the amplifier; and a bias feeding block that provides the adaptive bias signal to an input of the amplifier.

BRIEF DESCRIPTION OF THE DRAWINGS

Figure 1:
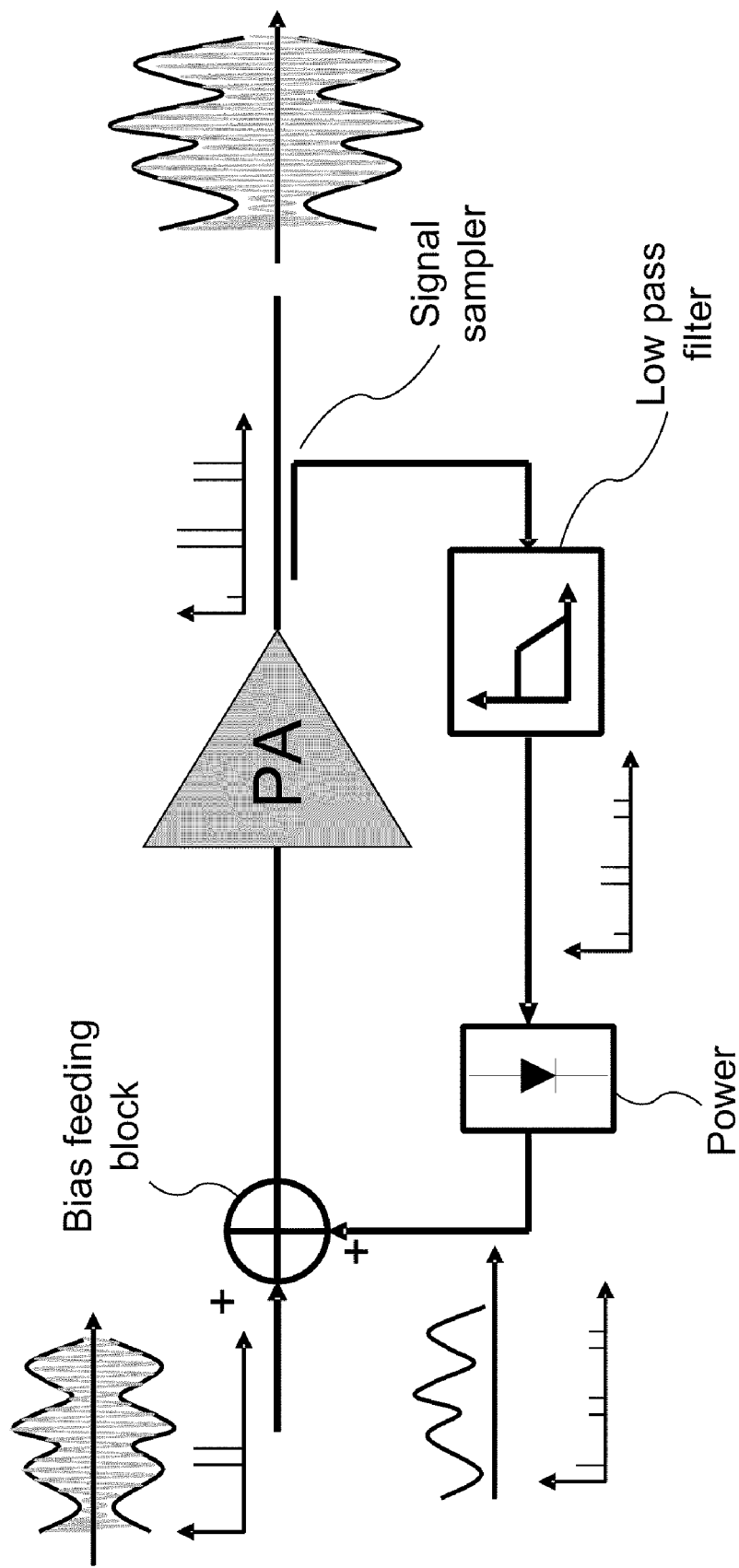

Having thus described the invention in general terms, reference will now be made to the accompanying drawings, which are not necessarily drawn to scale, and wherein:

FIG. 1 is a schematic diagram for a power amplifier with a conventional adaptive bias circuit.

Figure 2:
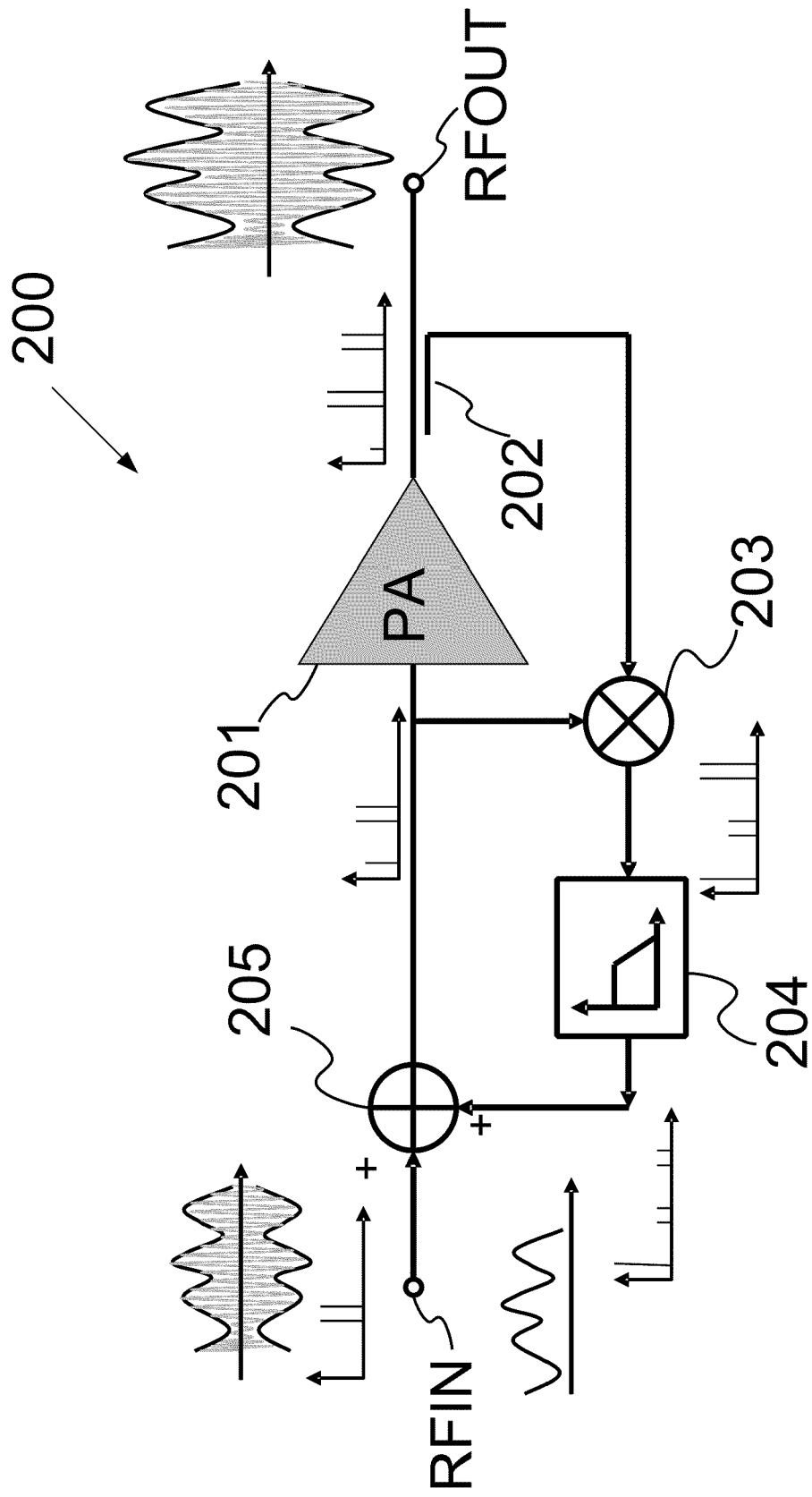

FIG. 2 illustrates an example system for a power amplifier and a self-mixing adaptive bias circuit, according to an example embodiment of the invention.

Figure 3:
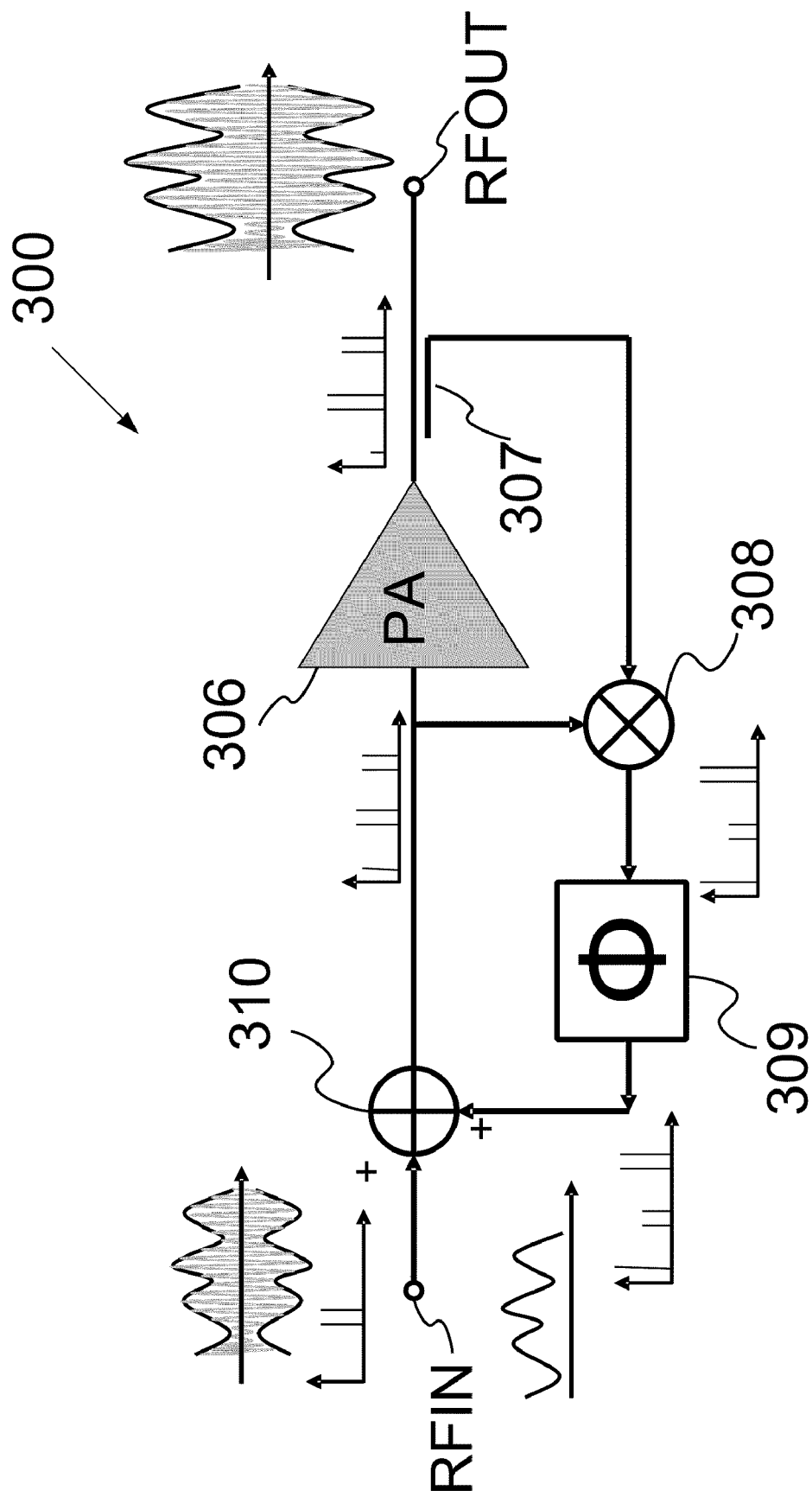

FIG. 3 illustrates another example system for a power amplifier and self-mixing adaptive bias circuit, according to an example embodiment of the invention.

Figure 4:
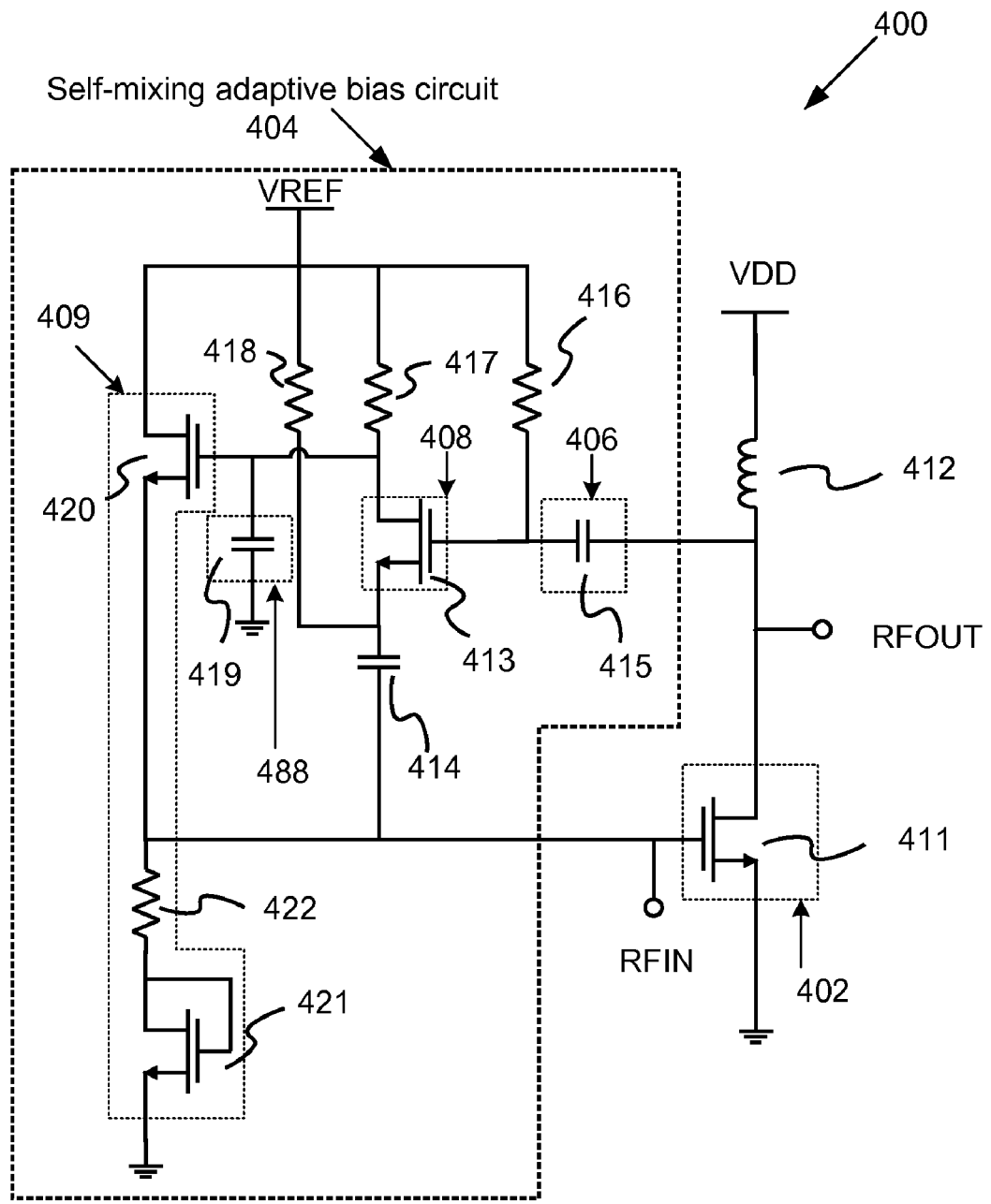

FIG. 4 illustrates a schematic diagram of an example self-mixing adaptive bias circuit in accordance with an example embodiment of the invention.

Figure 5:
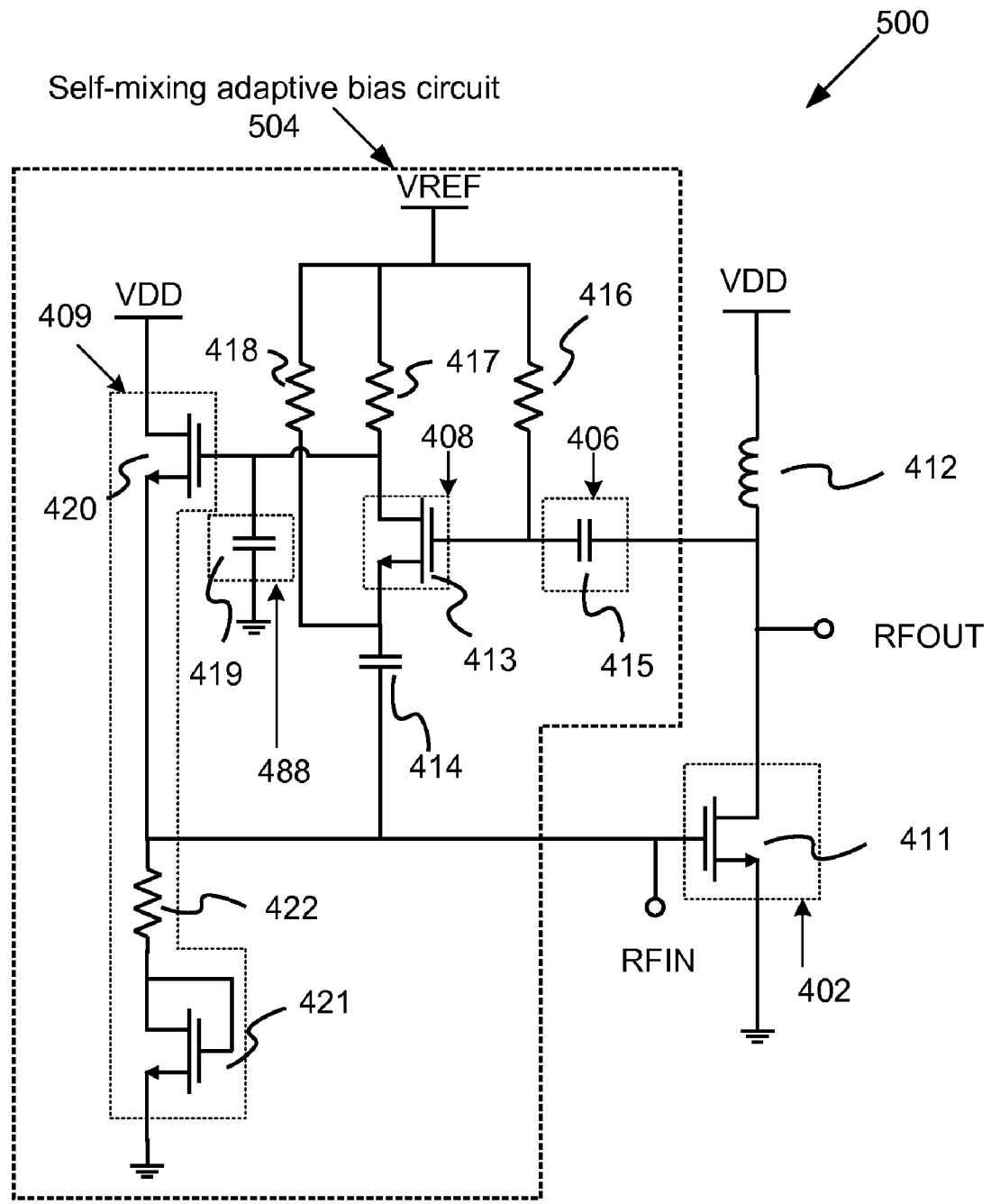

FIG. 5 illustrates a schematic diagram of another example adaptive bias circuit in accordance with an example embodiment of the invention.

Figure 6:
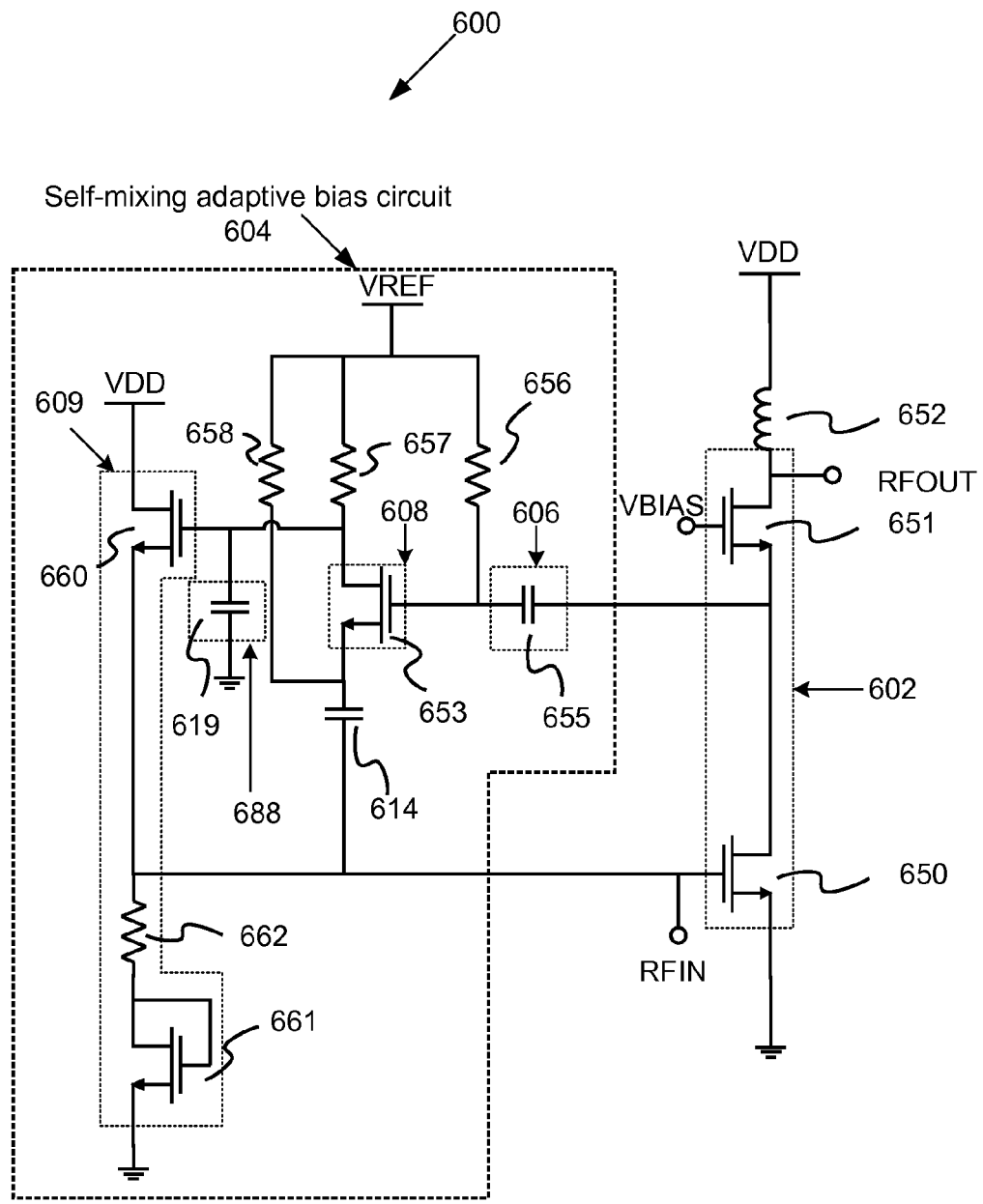

FIG. 6 illustrates a cascode power amplifier and an example self-mixing adaptive bias circuit, according to an example embodiment of the invention.

Figure 7:
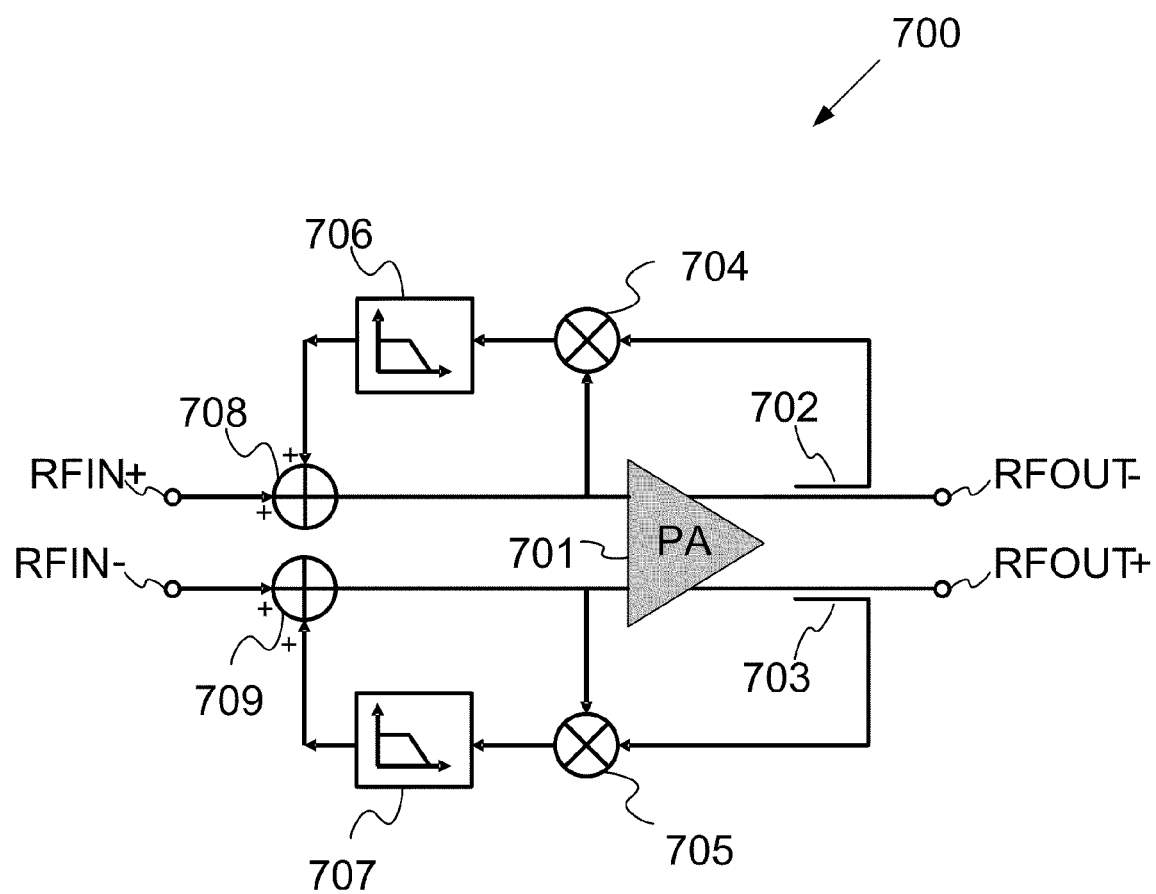

FIG. 7 illustrates an example system for a differential amplifier with two self-mixing adaptive bias circuits, according to an example embodiment of the invention.

Figure 8:
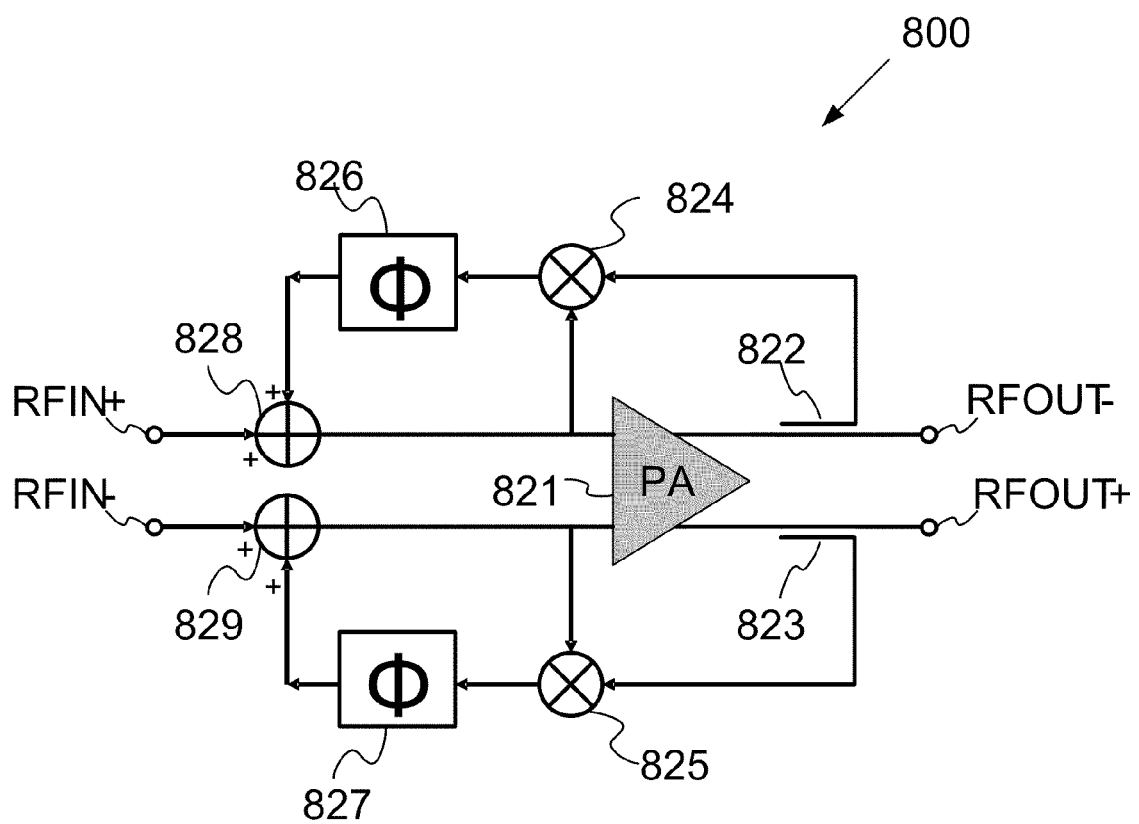

FIG. 8 illustrates an example system for a differential amplifier with two self-mixing adaptive bias circuits, according to an example embodiment of the invention.

Figure 9:
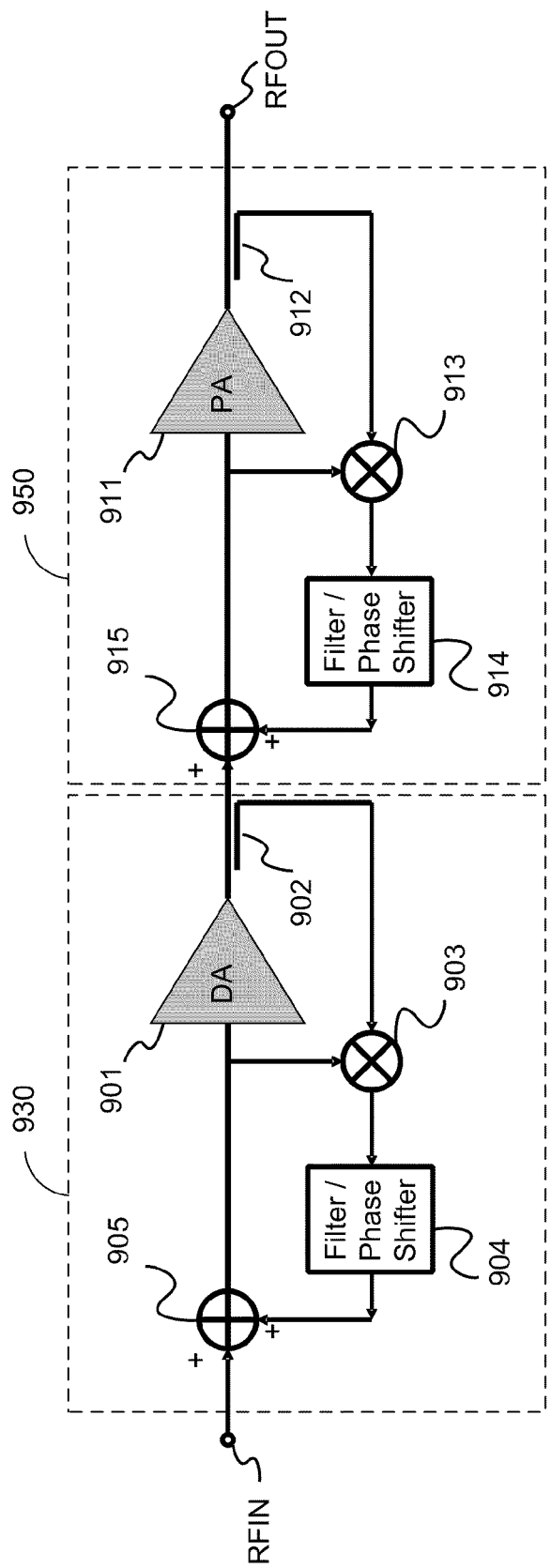

FIG. 9 illustrates an example multi-stage amplifier having multiple self-mixing adaptive bias circuits, according to an example embodiment of the invention.

DETAILED DESCRIPTION OF THE INVENTION

Embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Example embodiments of the invention may provide for adaptive biasing for power amplifiers. As will be described herein, adaptive biasing can generate an appropriate bias to enhance the performance of power amplifiers with respect to their input and/or output power levels. Indeed, if the bias of the amplifier is controlled adaptively, it can achieve better performance compared to an amplifier with fixed bias conditions. For instance, if the amplifier is biased near class-B at a low power region and class-A at a high power region, it can achieve better efficiency at the low power region and better linearity at the high power region while still meeting acceptable linearity specifications at the low power region and acceptable efficiency specifications at the high power region, according to an example embodiment of the invention.

While example embodiments of the invention are illustrated herein with respect to field-effect transistors (FETs) such as metal-oxide-semiconductor FETs (MOSFETs), it should be appreciated that bipolar junction transistors (BJTs) may equally be utilized instead of FETs. As an example, FETs may have respective gates, sources, and drains while BJTs may have respective bases, emitters, and collectors. Thus, any gate, source, or drain of a FET discussed herein could likewise be substituted with a corresponding base, emitter, or collector of a BJT without departing from example embodiments of the invention.

FIG. 2 illustrates a system 200 for a power amplifier (PA) 201 and an example self-mixing adaptive bias circuit in accordance with an example embodiment of the invention. The power amplifier (PA) 201 may be generally operative to amplify a radio frequency (RF) input signal RFIN and generate an RF output signal RFOUT. The PA 201 may be comprised of one or more transistors, including one or more metal-oxide-semiconductor field effect transistors (MOSFETs) or bipolar junction transistors (BJTs), according to an example embodiment.

The self-mixing adaptive bias circuit may be operative to generate an appropriate adaptive bias signal for operation of the PA 201 based upon the input (e.g., RFIN) and/or output (e.g., RFOUT) power levels. As shown in FIG. 2, the self-mixing adaptive bias circuit may include a signal sampler 202, a mixer 203, a low-pass filter 204, and a bias feeding circuitry or block 205. The signal sampler 202 may be operative to sample the output signal RFOUT to generate a sampled output signal. In an example embodiment of the invention, the signal sampler 202 may be comprised of a capacitor, a line coupler, or another device. The mixer 203 may be operative to mix the PA 201 input signal and the sampled output signal provided by signal sampler 202. The mixer 203 may be comprised of one or more transistors, including MOSFETs or BJTs, according to an example embodiment of the invention. The low-pass filter 204 may be operative to filter out high frequency components (e.g., carrier frequency of RFIN/RFOUT). The low-pass filter 204 may be comprised of at least one capacitor and optionally at least one resistor, according to an example embodiment of the invention. The bias feeding circuitry or block 205 may be operative to perform DC level shifting and feed filtered adaptive bias to the PA 201 input. As an example, the input RFIN may be connected to a transistor gate (or alternatively, a base) and biased at a first voltage (e.g., 0.5V) while the output of the low-pass filter 204 is connected to a transistor drain (or alternatively, a collector) and biased at a second voltage (e.g., 3.3V) higher than the first voltage. DC level shifting may be performed by the bias feeding block 205 to shift the second voltage (e.g., 3.3V) to the first voltage (e.g., 0.5V) since a DC blocking capacitor may not be utilized for the bias feeding circuitry or block 205. The bias feeding circuitry or block 205 may be comprised of one or more transistors, including MOSFETs or BJTs, according to an example embodiment of the invention.

With continued reference to FIG. 2, the input signal RFIN may contain pure signals without any harmonics and intermodulations, according to an example embodiment of the invention. The output signal RFOUT may contain amplified input signals as well as harmonics and intermodulations which are generated by power amplifier (e.g., PA 201) non-linearity. In an example embodiment, the mixer 203 may mix two inputs—(i) the PA input signal and (ii) the sampled output signal generated by sampler 202. The output of the mixer 203 may be a mixed signal containing large second harmonics, large baseband signals, and small leakage of fundamental signals because both mixer inputs have the same carrier frequency, where the same frequency mixing is called self-mixing. The self-mixed signal output by the mixer 203 may be provided to the low-pass filter 204, which filters out high frequency terms to generate an adaptive bias signal. Thus, the adaptive bias signal output by the low-pass filter 204 may comprise a baseband signal which comes from self-mixing of carrier frequency. The adaptive bias signal, which comprises a low-pass filtered signal that includes the baseband signal, may be fed from the low-pass filter 204 into an input of the PA 201 through the bias feeding circuitry or block 205. The bias feeding circuitry or block 205 may generate appropriate bias level with simple DC level shifting applied to the received adaptive bias signal from the low-pass filter 204. As the input and output power corresponding to RFIN and RFOUT increases, the mixer 203 output power increases, and the resulting mixed signal output by the mixer 203 is subsequently low-pass filtered by filter 204 and fed as an adaptive bias signal into the input of the PA 201 via bias feeding circuitry or block 205. As the input and output power increase, the gate bias of a MOSFET (or alternatively, a base current for a BJT) of the power amplifier 201 also increases following the envelope of the input signal RFIN, according to an example embodiment of the invention.

FIG. 3 illustrates a system 300 for a power amplifier and an example self-mixing adaptive bias circuit, according to an example embodiment of the invention. The power amplifier (PA) 306 may be generally operative to amplify a radio frequency (RF) input signal RFIN and generate an RF output signal RFOUT. The PA 306 may be comprised of one or more transistors, including one or more metal-oxide-semiconductor field effect transistors (MOSFETs) or bipolar junction transistors (BJTs), according to an example embodiment.

The self-mixing adaptive bias circuit may be operative to generate an appropriate bias signal for operation of the PA 306 based upon the input and/or output power levels. As shown in FIG. 3, the self-mixing adaptive bias circuit may include a signal sampler 307, a mixer 308, a phase shifter 309, and a bias feeding circuitry or block 310. The signal sampler 307 may be operative to sample output signal RFOUT to generate a sampled output signal. In an example embodiment of the invention, the signal sampler 307 may be comprised of a capacitor, a line coupler, or another device. The mixer 308 may be operative to mix the PA 306 input signal and the sampled output signal provided by the signal sampler 307. The mixer 308 may be comprised of one or more transistors, including MOSFETs or BJTs, according to an example embodiment of the invention. The phase shifter 309 may be operative to shift the phase of the mixer 308 output signal to generate a phase-shifted mixed signal. The phase shifter 309 may be comprised of a capacitor, according to an example embodiment of the invention. The bias feeding circuitry or block 310 may be operative to feed phase-shifted adaptive bias to PA 306 input. The bias feeding circuitry or block 310 may be comprised of one or more transistors, including MOSFETs or BJTs, according to an example embodiment of the invention.

With continued reference to FIG. 3, the input signal RFIN may contain pure signals without any harmonics and intermodulations, according to an example embodiment of the invention. The output signal RFOUT may contain amplified input signals as well as harmonics and intermodulations which are generated by power amplifier (e.g., PA 306) nonlinearity. In an example embodiment of the invention, the mixer 308 may mix two inputs—(i) the PA input signal and (ii) the sampled output signal generated by sampler 307. The output of the mixer 308 may contain large second harmonic, large baseband signals, and small leakage of fundamental signals because both mixer inputs have the same carrier frequency, where the same frequency mixing is called self-mixing. The self-mixed signal output by the mixer 308 may be provided to phase shifter 309, which shifts the phase of the mixed signal output by the mixer 308 to generate an adaptive bias signal. The adaptive bias signal, which comprises a phase-shifted signal, may be fed from the phase shifter 309 to the input of power amplifier 306 through the bias feeding circuitry or block 310, which may apply simple DC level shifting, as described above, to the adaptive bias signal. The phase-shifted baseband signal and the second harmonic signal or the baseband signal and the phase-shifted second harmonic signal may generate additional third-order intermodulation terms. In an example embodiment of the invention, the additional third-order intermodulation terms may be out-of-phase and equal in amplitude to the original third-order intermodulation terms generated by amplifier (e.g., PA 306) nonlinearity such that the output third-order intermodulations can be canceled out. The phase of the third-order intermodulation terms may be controlled with the phase shifter 309 while the insertion loss (or gain) of the third-order intermodulation terms may be controlled by the mixer 308. As the input and output power corresponding to RFIN and RFOUT increases increase, the mixer 308 output power increases, and the resulting mixed signal output by the mixer 308 is phase-shifted and fed into the input of the amplifier 306. Therefore, as the input and output power increase, the gate bias of a MOSFET (or alternatively, a base current for a BJT) of the PA 306 also increases following the envelope of the input signal RFIN with phase shifted baseband and second harmonic terms, according to an example embodiment of the invention.

FIG. 4 illustrates schematic diagram 400 of a power amplifier (PA) 402 and an example self-mixing adaptive bias circuit 404 in accordance with an example embodiment of the invention. It will be appreciated that the schematic diagram 400 of FIG. 4 may represent an example implementation of the example power amplifiers and self-mixing adaptive bias circuits described with reference to FIG. 2 or 3.

As shown in FIG. 4, the power amplifier (PA) 402 may be operative to amplify input signal RFIN and generate output signal RFOUT. The PA 402 may be comprised of at least one transistor 411, which may be a FET, and more particularly, an N-channel MOSFET, according to an example embodiment of the invention. The transistor 411 may include a gate, source, and drain. The source of the transistor 411 may be connected to ground (GND). The gate of the transistor 411 may be connected to the input signal RFIN and the adaptive bias circuit 404. The drain of the transistor 411 may provide the output signal RFOUT. The drain of the transistor 411 may also be connected to the adaptive bias circuit 404, as well as to a first end of choke inductor 412. The second end of the choke inductor 412 may be connected to the supply voltage VDD.

The self-mixing adaptive bias circuit 404 may be comprised of a signal sampler 406, a mixer 408, a filter or phase shifter 409, and bias feeding circuitry or block 409. The signal sampler 406 may be comprised of a capacitor 415 in which a first end is electrically connected to the drain of PA 402 for receiving the output signal RFOUT, and a second end is connected to the gate of transistor 413 of mixer 408. Alternatively, the signal sampler may be a line coupler that is not electrically connected, but rather magnetically coupled, to the output signal RFOUT. The signal sampler 406 may be operative to sample the output signal RFOUT and provide the sampled output signal to the mixer 408.

The mixer 408 may be comprised of a transistor 413. The transistor 413 may be a FET, and more particularly an N-channel MOSFET, according to an example embodiment of the invention. The transistor 413 may have a gate, source, and drain. The gate, drain, and source of the transistor 413 may be biased at the same DC level (reference voltage VREF) through biasing resistors 416, 417, and 418, respectively. However, the transistor 413 may not consume DC current. The transistor 413 may receive the sampled output signal from the signal sampler 406 through the gate of transistor 413 (e.g., a first input port for mixer 408). In addition, the transistor 413 may further receive the PA 402 input signal through the source of transistor 413 (e.g., a second input port for mixer 408), which is connected to a first end of a DC blocking capacitor 414. The second end of the DC blocking capacitor 414 is connected to the gate of transistor 402 as well as to the bias feeding circuitry or block 409, as described in further detail herein. It will be appreciated that the source of the transistor 413 is connected with the gate of the PA 402 through DC blocking capacitor 414 because transistor 413 may be a FET (e.g., MOSFET) that requires high voltage swing at its gate to operate as a passive mixer 408 and the drain of the transistor 411 has a higher voltage swing than at the gate.

The mixer 408 comprising transistor 413 may mix the PA 402 input signal and the sampled output signal to generate a mixed signal that is output by the drain of transistor 413 (e.g., an output port for mixer 408). A phase shifter or low-pass filter 488 may receive the mixed signal from the transistor 413. The phase shifter or low-pass filter 488 may be operative to shift phases or filter out high frequency components from the received mixed signal to generate an adaptive bias signal. The phase shifter or low-pass filter 488 may be comprised of a capacitor 419. The capacitor 419 may have a first end connected to the drain of transistor 413 as well as the gate of transistor 420 of the bias feeding circuitry or block 409, and a second end connected to ground (GND). It will be appreciated that the capacitor 419 may be operative as a low-pass filter or a phase shifter, according to an example embodiment of the invention. If the capacitor 419 is large enough to reject the second harmonic, it can be considered a low-pass filter. If the capacitor 419 is too small to reject the second harmonic but enough to shift the phase of the signal, it can be considered a phase shifter, according to an example embodiment of the invention. Indeed, the phase shifter may comprise the capacitor 419 (e.g., a shunt capacitor) along with a series resistance from the mixer 408 (e.g., resistance from a drain or collector of transistor 413).

The adaptive bias signal, which may include the filtered or phase-shifted mixed signal from filter or phase shifter 408, to the bias feeding circuitry or block 409. The bias feeding circuitry or block 409 may apply appropriate DC level shifting and feed phase-shifted or filtered adaptive bias signal to the PA 402 input through the gate of transistor 411. The bias feeding circuitry or block 409 may include a first transistor 420, a resistor 422, and a second transistor 421. The transistors 420 and 421 may be FETs, and more particularly, N-channel MOSFETs, according to an example embodiment of the invention.

The first transistor 420 may be configured as a source follower (or alternatively, an emitter follower if a BJT is utilized instead of a FET), according to an example embodiment of the invention. The source follower shifts the voltage level of the mixer 408 output (via the drain of transistor 413) to the gate of the transistor 411 for PA 402. To do so, the gate of the first transistor 420 may be connected to first end of the capacitor 419 (of filter or phase shifter 408) and the gate of transistor 413 (of mixer 408). The drain of the first transistor 420 may be connected to the voltage source VREF. It will be appreciated that reference voltage VREF not only biases the passive transistor 413 though biasing resistors 416, 417, 418, but also supplies current to the source follower comprising the first transistor 420. The source of the first transistor 420 is connected to the gate of transistor 411 of PA 402. Thus, the level-shifted mixer 408 output signal may be provided as an input to the PA 402.

The source of the first transistor 420 may also be connected to a first end of a resistor 422, and a second end of resistor 422 may be connected to a drain of the diode-connected transistor 421. To obtain a diode-connected transistor 421, the gate of transistor 421 may be connected to the drain of transistor 421. The source of diode-connected transistor 421 may be connected to ground (GND). Thus, the diode-connected transistor 421 and the resistor 422 may a current path for the source follower comprising the first transistor 420. The resistor 422 may prevent RF signal leakage through the diode-connected transistor 421. It will be appreciated that in alternative embodiments of the invention, a diode may be utilized in place of diode-connected transistor 421

The initial bias voltage of the self-mixing adaptive bias circuit or block 409 may be determined according to the reference voltage VREF, the resistor 422, and the diode-connected transistor 421. As the input and output power increase, the mixer 408 output power increases. The mixer 408 output signal is low-pass filtered or phase-shifted to generate an adaptive bias signal. The DC level of the low-pass filtered or phase-shifted mixed signal is level-shifted with the source follower comprising transistor 420 and the level-shifted adaptive bias signal is fed into the gate of the transistor 411 of PA 402. Therefore, as the input and output power increase, the gate bias (or base current if PA 402 utilizes a BJT instead of a FET) of the PA 402 also increases following the envelope of the input.

FIG. 5 illustrates a schematic diagram 500 of a power amplifier (PA) 402 and an example self-mixing adaptive bias circuit 504 in accordance with an example embodiment of the invention. It will be appreciated that the self-mixing adaptive bias circuit 504 of FIG. 5 is similar to the self-mixing adaptive bias circuit 404 of FIG. 4, except the drain of transistor 420 that operates as the source follower or emitter follower is connected to supply voltage VDD instead of reference voltage VREF. Accordingly, supply voltage VDD can be used independently of reference voltage VREF to bias the source follower or emitter follower. The biasing of the source follower or emitter follower according to voltage supply VDD can initiate the adaptive bias output signal for receipt by the amplifier 402. In addition, reference voltage VREF is used for biasing the gate, drain, and source of the transistor 413 (of mixer 408) through biasing resistors 416, 417, 418, respectively. However, since the reference voltage VREF does not need to flow current to the mixer 408, the VREF generating block may be implemented with a simple voltage dividing structure. In an example embodiment of the invention, an example voltage dividing structure may comprise two series resistors between voltage supply VDD and ground, where the divided voltage can be obtained from a middle node of the two series resistors. Therefore, the VREF generating block may easily be integrated with the other blocks in a single semiconductor chip.

FIG. 6 illustrates a cascode power amplifier 602 and an example self-mixing adaptive bias circuit 604 in accordance with an example embodiment of the invention. As shown in FIG. 6, the cascode power amplifier 602 may be comprised of a common source amplifier (CS) 650, a common gate amplifier (CG) 651, which may amplify input signal RFIN and produce output signal RFOUT. The self-mixing adaptive bias circuit 604 may include a signal sampler 606 which samples a signal at the node between two transistors 650, 651 of the cascode amplifier 602, a mixer 608 which mixes the cascode PA 602 input signal and the sampled signal from the node between two transistors 650, 651, a low-pass filter or phase shifter 619, and bias feeding circuitry or block 609 that may feed filtered or phase-shifted adaptive bias to the cascode PA 652 input.

Still referring to FIG. 6, the cascode amplifier 602 receives an input signal RFIN at the gate of transistor 650 and generates an amplified output signal RFOUT at the drain of transistor 651. The mixer 608 may comprise a transistor 653 (e.g., a field-effect-transistor (FET)) having a gate, drain, and source that are biased at the reference voltage VREF through biasing resistors 656, 657, 658, respectively. The gate of the transistor 653 of the mixer 608 is likewise connected with the node between two transistors 650, 651 of the cascode amplifier 602 through the signal sampler 606, which may comprise a DC blocking capacitor 655. It may be appreciated that the source of the transistor 653 of the mixer 608 may be connected with the input of the cascode amplifier 602 through DC blocking capacitor 654 because the mixer 608 may comprise a FET for transistor 653 that requires high voltage swing at its gate to operate as a passive mixer and the node between two transistors 650, 651 has a higher voltage swing than the gate. Additionally, the connections may reduce output power loss to the self-mixing adaptive bias circuit 604 because the output node RFOUT of the cascode amplifier 602 is not connected directly with the self-mixing adaptive bias circuit 604.

Transistor 660 of the bias feeding circuitry or block 609 may be configured as a source follower that shifts the voltage level of the mixer 653 output to the input of the cascode amplifier 602 via the gate of transistor 650. A diode-connected transistor 661 and a resistor 662, which also form part of the bias feeding circuitry or block 609, may provide a current path for the transistor 660 that is configured as a source follower (or alternatively, a emitter follower is a BJT is utilized for transistor 660 instead of a FET). The resistor 662 may prevent the RF signal leakage through the diode-connected transistor 661 in which the gate is connected to the drain. The source of the transistor 660 may be connected with the input of the cascode power amplifier 602 via the gate of transistor 650. Thus, the level-shifted mixer 608 output signal is provided to the input of the cascode amplifier 602 via the gate of the transistor 650. The capacitor 659 may be used as (1) a low-pass filter or (2) a phase shifter. If the capacitor 659 is large enough to reject the second harmonic, it can be considered a low-pass filter. If the capacitor 659 is too small to reject the second harmonic but enough to shift the phase of the signal, it can be considered a phase shifter. The drain of the transistor 660 is connected with the voltage VDD. The initial bias voltage of the self-mixing adaptive bias circuit 604 may be determined according to the reference voltage VREF, the resistor 662, and the diode-connected transistor 661. The VREF generating block may be implemented with simple voltage dividing structure because the reference voltage VREF does not need to flow current to the mixer 608. Therefore, the VREF generating block may be easily integrated together with other blocks. As the input and output power increase, the mixer 608 output power increases. The mixer 608 output signal is low-pass filtered or phase-shifted by the low-pass filter or phase shifter 688 to generate an adaptive bias signal. The DC level of the adaptive bias signal is shifted with the source follower (or alternatively, emitter follower) comprising transistor 660 and the level-shifted signal may be fed into the input of the cascode amplifier 602 via the gate of transistor 650. Therefore, as the input and output power increase, the gate bias (or alternatively, a base current for a bipolar junction transistor (BJT)) of transistor 650 of the cascode amplifier 650 also increases following the envelope of the input.

FIG. 7 illustrates an example system 700 for a differential power amplifier 701 and an example self-mixing adaptive bias circuit, according to an example embodiment of the invention. The differential power amplifier 701 may be generally operative to amplify input differential signals RFIN+, RFIN− and generate differential output signals RFOUT+, RFOUT−. The differential amplifier may be comprised of transistors such as FETs or BJTs, according to an example embodiment of the invention.

The self-mixing adaptive bias circuit may be operative to generate an appropriate bias signal for operation of the PA 701 based upon the input and/or output power levels. As shown in FIG. 7, the adaptive bias circuit may include two signal samplers 702, 703 which sample output signals RFOUT−, RFOUT+, respectively; two mixers 704, 705 which mix the input signal and the sampled output signal at the each path of differential sides of the PA 701; two low-pass filters 706, 707 which may filter out high frequency components on each path of differential sides of the PA 701; and two bias feeding blocks 708, 709 which may apply DC level shifting and feed filtered signals to the PA 701 differential inputs, respectively.

FIG. 8 illustrates an example system 800 for a differential power amplifier 821 and an example self-mixing adaptive bias circuit, according to an example embodiment of the invention. The differential power amplifier (PA) 821 may be generally operative to amplify input differential signals RFIN+, RFIN− and generate differential output signals RFOUT+, RFOUT−. The differential amplifier may be comprised of transistors such as MOSFETS or BJTS, according to an example embodiment of the invention.

The self-mixing adaptive bias circuit may be operative to generate an appropriate bias signal for operation of the PA 821 based upon the input and/or output power levels. As shown in FIG. 8, the adaptive bias circuit may include two signal samplers 822, 823 which sample output signals RFOUT−, RFOUT+, respectively; two mixers 824, 825 which mix the input signal and the sampled output signal at each respective side of the differential PA 721; two phase shifters 726, 727 which may shift the phase of the output signals of mixers on each path of differential sides of the PA 821; and two bias feeding blocks 828, 829 which may feed filtered signals to the PA 821 differential inputs, respectively.

It will be appreciated that the self-mixing adaptive bias circuit may be provided in one or more stages in a multi-stage amplifier, according to an example embodiment of the invention. For example, as shown in FIG. 9, there may be a first stage 930 and a second stage 950. The first stage 930 receives RFIN, and provides an output that is received as an input of the second stage 950. The output of the second stage 950 is RFOUT. The first stage 930 may include a driver amplifier 901 with a first self-mixing adaptive bias circuit. The first adaptive bias circuit may include a signal sampler 902, mixer 903, low-pass filter or phase shifter 904, and bias feeding circuitry or block 905, as similarly described herein. The second stage 950 may include a power amplifier 950 with a second self-mixing adaptive bias circuit. The second adaptive bias circuit may include a signal sampler 912, a mixer 913, low-pass filter or phase shifter 914, and bias feeding circuitry or block 905, as similarly described herein. In addition, multiple self-mixing adaptive bias circuits may be provided in one or more stages of multiple respective parallel amplifiers. In this scenario, each self-mixing adaptive bias circuit may have different respective initial bias and different adaptive biasing ranges, according to an example embodiment of the invention.

Many modifications and other embodiments of the invention will come to mind to one skilled in the art to which this invention pertains and having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A self-mixing adaptive bias circuit, comprising:
   a signal sampler that samples an output signal of an amplifier to generate a sampled output signal;
   a mixer that mixes the sampled output signal with an input signal to the amplifier to generate a mixed signal, wherein the sampled output signal and the input signal have a same carrier frequency, wherein the mixer comprises a passive mixer that includes a field effect transistor (FET);
   a low-pass filter that filters out high frequency components from the mixed signal to generate an adaptive bias signal; and
   a bias feeding block that provides the adaptive bias signal to an input of the amplifier.

2. The self-mixing adaptive bias circuit of claim 1, wherein the adaptive bias signal comprises a gate voltage or base current received at the input of the amplifier.

3. The self-mixing adaptive bias circuit of claim 1, wherein the high frequency components include components of the same carrier frequency.

4. The self-mixing adaptive bias circuit of claim 1, wherein the signal sampler is electrically connected or magnetically coupled to the output of the amplifier.

5. The self-mixing adaptive bias circuit of claim 4, wherein the signal sampler is either (i) a capacitor for electrically connecting to the output, or (ii) a line coupler for magnetically coupling to the output.

6. The self-mixing adaptive bias circuit of claim 1, wherein the FET of the mixer includes a gate, source, and drain, wherein the gate and the source are utilized as respective input ports for the sampled output signal and the input signal, wherein the drain is utilized as an output port for the generated mixed signal, wherein the gate, source, and drain are biased at a same DC level through respective biasing resistors.

7. The self-mixing adaptive bias circuit of claim 1, wherein the low-pass filter comprises a capacitor.

8. The self-mixing adaptive bias circuit of claim 1, wherein the bias feeding block comprises a source follower or an emitter follower that operates to provide DC level shifting to the adaptive bias signal prior to receipt at the input of the amplifier.

9. The self-mixing adaptive bias circuit of claim 8, wherein the bias feeding block further includes a resistor and a diode-connected transistor for providing a current path for the source follower or the emitter follower.

10. The self-mixing adaptive bias circuit of claim 1, wherein the amplifier is a cascode amplifier comprising a first transistor and a second transistor, wherein the signal sampler samples the output signal from a node between the first transistor and the second transistor.

11. The self-mixing adaptive bias circuit of claim 1,
wherein the amplifier is a differential amplifier having a first differential input signal corresponding to a first differential output signal, and a second differential input signal corresponding to a second differential output signal,
wherein the signal sampler samples the first differential output signal, wherein the mixer mixes the sampled output signal with the first differential input signal to generate the mixed signal.

12. A self-mixing adaptive bias circuit, comprising:
a signal sampler that samples an output signal of an amplifier to generate a sampled output signal;
a mixer that mixes the sampled output signal with an input signal to the amplifier to generate a mixed signal having a baseband signal and second harmonic signals, wherein the sampled output signal and the input signal have a same carrier frequency, wherein the mixer comprises a passive mixer that comprises a field effect transistor (FET);
a phase shifter that shifts the phase of baseband or second harmonic signals from the mixed signal to achieve cancellation of third-order intermodulation terms generated by the nonlinearity of the amplifier; and
a bias feeding block that provides the adaptive bias signal to an input of the amplifier.

13. The self-mixing adaptive bias circuit of claim 12, wherein the adaptive bias signal comprises a gate voltage or base current received at the input of the amplifier.

14. The self-mixing adaptive bias circuit of claim 12, wherein the signal sampler is electrically connected or magnetically coupled to the output of the amplifier.

15. The self-mixing adaptive bias circuit of claim 12, wherein the phase shifter comprises a shunt capacitor and a series resistance from the mixer.

16. The self-mixing adaptive bias circuit of claim 12, wherein the bias feeding block comprises a source follower or an emitter follower that operates to provide DC level shifting to the adaptive bias signal prior to receipt at the input of the amplifier.

17. The self-mixing adaptive bias circuit of claim 16, wherein the bias feeding block further includes a resistor and a diode-connected transistor for providing a current path for the source follower or the emitter follower.

18. The self-mixing adaptive bias circuit of claim 12,
wherein the amplifier is a differential amplifier having a first differential input signal corresponding to a first differential output signal, and a second differential input signal corresponding to a second differential output signal,
wherein the signal sampler samples the first differential output signal, wherein the mixer mixes the sampled output signal with the first differential input signal to generate the mixed signal.

* * * * *